United States Patent
Jin et al.

(10) Patent No.: US 12,044,951 B2
(45) Date of Patent: Jul. 23, 2024

(54) ILLUMINATION SOURCE AND ASSOCIATED METROLOGY APPARATUS

(71) Applicant: ASML Netherlands B.V., Veldhoven (NL)

(72) Inventors: Wenjie Jin, Eindhoven (NL); Nan Lin, Eindhoven (NL); Christina Lynn Porter, Eindhoven (NL); Petrus Wilhelmus Smorenburg, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 98 days.

(21) Appl. No.: 17/769,725

(22) PCT Filed: Oct. 7, 2020

(86) PCT No.: PCT/EP2020/078122
§ 371 (c)(1),
(2) Date: Apr. 15, 2022

(87) PCT Pub. No.: WO2021/073979
PCT Pub. Date: Apr. 22, 2021

(65) Prior Publication Data
US 2022/0382124 A1 Dec. 1, 2022

(30) Foreign Application Priority Data

Oct. 17, 2019 (EP) .................................. 19203732
Dec. 16, 2019 (EP) .................................. 19216363

(51) Int. Cl.
*G02F 1/355* (2006.01)
*G02F 1/35* (2006.01)
*G03F 7/00* (2006.01)

(52) U.S. Cl.
CPC .............. *G02F 1/354* (2021.01); *G02F 1/355* (2013.01); *G03F 7/70033* (2013.01); *G03F 7/706847* (2023.05)

(58) Field of Classification Search
CPC ........... G03F 7/706847; G03F 7/70041; G02F 1/354; G02F 1/355
See application file for complete search history.

(56) References Cited

U.S. PATENT DOCUMENTS 6,952,253 B2  10/2005  Lof et al.
7,701,577 B2  4/2010  Straaijer et al.
(Continued)

FOREIGN PATENT DOCUMENTS

CN  101515105 B  7/2010
EP  1 628 164 A  2/2006
(Continued)

OTHER PUBLICATIONS

Machine translation of JP-2005285675-A (Year: 2005).*
(Continued)

*Primary Examiner* — Steven Whitesell Gordon
(74) *Attorney, Agent, or Firm* — Sterne, Kessler, Goldstein & Fox P.L.L.C.

(57) ABSTRACT

Disclosed is an illumination source comprising a gas delivery system comprising a gas nozzle. The gas nozzle comprises an opening in an exit plane of the gas nozzle. The gas delivery system is configured to provide a gas flow from the opening for generating an emitted radiation at an interaction region. The illumination source is configured to receive a pump radiation having a propagation direction and to provide the pump radiation in the gas flow. A geometry shape of the gas nozzle is adapted to shape a profile of the gas flow such that gas density of the gas flow first increases to a (Continued)

maximum value and subsequently falls sharply in a cut-off region along the propagation direction.

16 Claims, 7 Drawing Sheets

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 10,530,111 | B2 | 1/2020 | Srivastava et al. |
| 2005/0100071 | A1 | 5/2005 | Taylor et al. |
| 2006/0066855 | A1 | 3/2006 | Boef et al. |
| 2007/0224518 | A1 | 9/2007 | Yokhin et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2016/0161863 | A1 | 6/2016 | Den Boef et al. |
| 2016/0282282 | A1 | 9/2016 | Quintanilha et al. |
| 2016/0370717 | A1 | 12/2016 | Den Boef et al. |
| 2017/0184981 | A1 | 6/2017 | Quintanilha et al. |
| 2018/0267411 | A1* | 9/2018 | Srivastava ............ H01S 3/0092 |

FOREIGN PATENT DOCUMENTS

| | | | |
|---|---|---|---|
| JP | 2005285675 | A * | 10/2005 |
| KR | 2010134982 | A * | 12/2010 |
| TW | 2019-01304 | A | 1/2019 |
| WO | WO 2011/012624 | A1 | 2/2011 |
| WO | WO 2018/166741 | A1 | 9/2018 |

OTHER PUBLICATIONS

Machine translation of KR-2010134982-A (Year: 2010).*
Wachulak et al., Characterization of gas puff targets for laser matter interaction experiments, using extreme ultraviolet and soft Xray radiography and tomography techniques, Laser Plasma Targetry Workshop, Paris, Apr. 20-22, 2015 (Year: 2015).*
International Search Report and Written Opinion of the International Searching Authority directed to related International Patent Application No. PCT/EP2020/078122, mailed Dec. 23, 2020; 9 pages.
Goh et al., "Single-shot fluctuations in waveguided high-harmonic generation," Optics Express, vol. 23, No. 19, Sep. 14, 2015; pp. 24888-24902.
Landgraf et al., "High resolution 3D gas-jet characterization," Review of Scientific Instruments, vol. 82, No. 8, Aug. 17, 2011; pp. 1-6.
Kim et al., "Characterizations of symmetry and asymmetry high-density gas jets without Abel inversion," Review of Scientific Instruments, vol. 75, No. 9, Sep. 2, 2004; pp. 2865-2868.
Heyl et al., "A nozzle for high-density supersonic gas jets at elevated temperatures," Review of Scientific Instruments, vol. 89, No. 113114, Nov. 19, 2018; pp. 1-5.
International Preliminary Report on Patentability directed to related International Patent Application No. PCT/EP2020/078122, issued Apr. 19, 2022; 6 pages.
Lemaillet et al., "Intercomparison between optical and x-ray scatterometry measurements of FinFET structures," Proc. of SPIE, Metrology, Inspection, and Process Control for Microlithography XXVII, vol. 8681, Apr. 10, 2013; 8 pages.

* cited by examiner

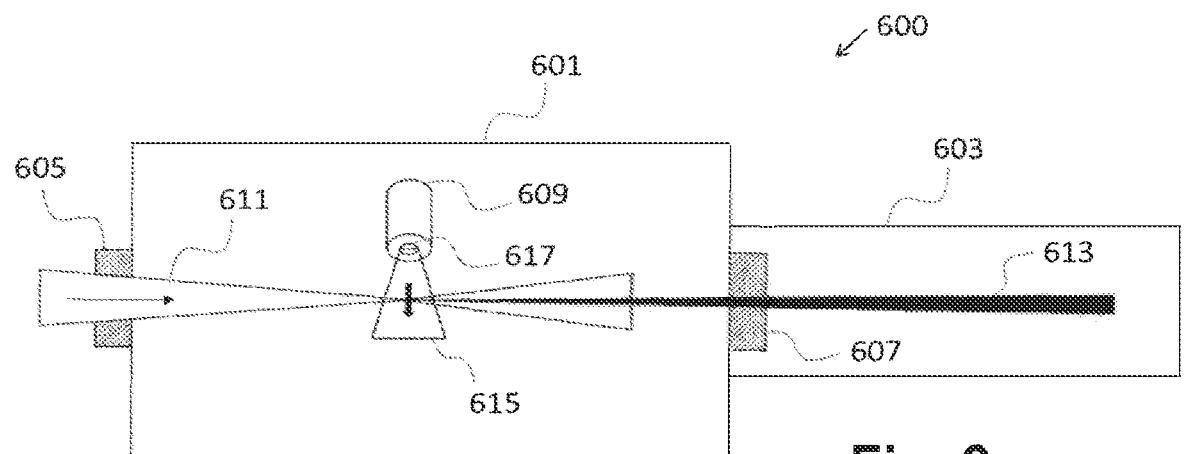
Fig. 6
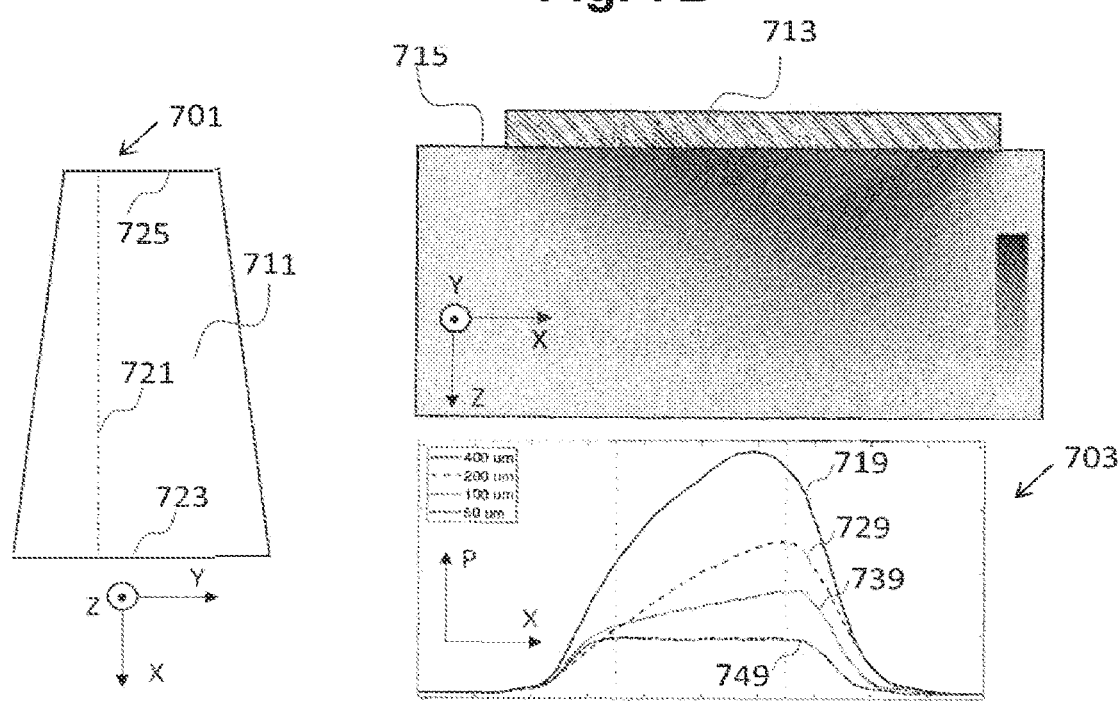
Fig. 7B
Fig. 7A          Fig. 7C

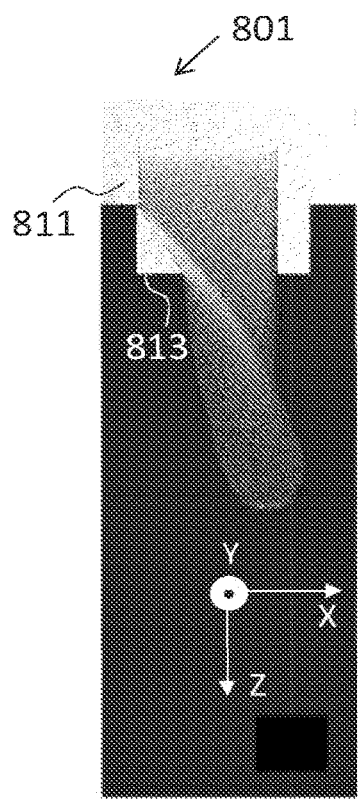
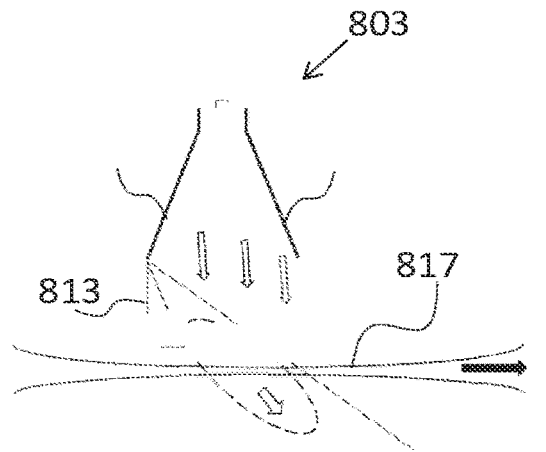
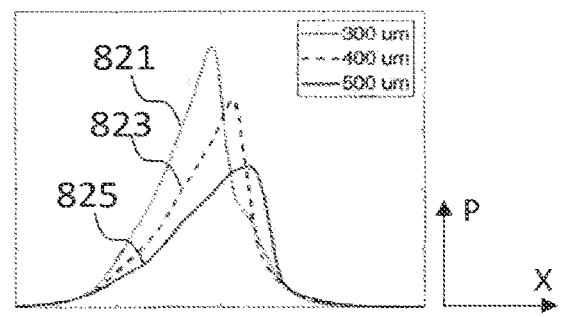
Fig. 8A  Fig. 8B
Fig. 8C

ILLUMINATION SOURCE AND ASSOCIATED METROLOGY APPARATUS

CROSS REFERENCE TO RELATED APPLICATIONS

This application claims priority of EP application 19203732.3 which was filed on 2019 Oct. 17 and EP application 19216363.2 which was filed on 2019 Dec. 16 and which is incorporated herein in its entirety by reference.

FIELD

The present invention relates to illumination source, metrology apparatus and a method of delivering gas in an illumination source.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray" wavelength spectrum), it is possible to resolve smaller structures, to increase sensitivity to structural variations of the structures and/or penetrate further into the product structures. One such method of generating suitably high frequency radiation (e.g., soft X-ray and/or EUV radiation) may be using a pump radiation (e.g., infra-red radiation) to excite a generating medium, thereby generating an emitted radiation, optionally a high harmonic generation comprising high frequency radiation.

SUMMARY

According to a first aspect of the disclosure, there is provided an illumination source comprising a gas delivery system comprising a gas nozzle. The gas nozzle comprises an opening in an exit plane of the gas nozzle. The gas delivery system is configured to provide a gas flow from the opening for generating an emitted radiation at an interaction region. The illumination source is configured to receive a pump radiation having a propagation direction and to provide the pump radiation in the gas flow. A geometry shape of the gas nozzle is adapted to shape a profile of the gas flow such that gas density of the gas flow first increases to a maximum value and subsequently falls sharply in a cut-off region along the propagation direction.

Optionally, the profile of the gas flow is to suppress an energy divergence of the pump radiation inside the gas flow, wherein the energy divergence is caused by the fact that a portion of the gas flow is ionized by the pump radiation.

Optionally, the maximum value is above a phase-matching pressure.

Optionally, a cut-off region length of the profile of the gas flow in the propagation direction of the pump radiation is less than 100 μm.

Optionally, a shape of the opening in the exit plane is asymmetric to planes perpendicular to the propagation direction of the pump radiation.

Optionally, width of the opening gradually increases along the propagation direction of the pump radiation.

Optionally, the shape of the opening is a trapezoid.

Optionally, the shape of the opening is an isosceles trapezoid.

Optionally, an interior cross-sectional area of the gas nozzle in a plane parallel to the exit plane increases along direction of the gas flow for at least a portion of the gas nozzle.

Optionally, the illumination source comprises an adjustable element for altering the profile of the gas flow.

Optionally, the adjustable element is for altering the profile of the gas flow during generating the emitted radiation.

Optionally, the adjustable element is configured for being positioned at least partly in the gas flow.

Optionally, the illumination source comprises a pump radiation source operable to emit the pump radiation.

Optionally, the illumination source is for high harmonic generation.

Optionally, the gas flow is provided by the gas delivery system into an evacuated or nearly evacuated space.

Optionally, the emitted radiation has a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

Optionally, in operation the emitted radiation is guided to a target on a wafer.

Optionally, the emitted radiation is for metrology measurements.

Optionally, the illumination source comprising a temperature controlling assembly.

According to another aspect of the disclosure there is provided a method of delivering gas in an illumination source comprising providing a gas flow from an opening in an exit plane of a gas nozzle for receiving a pump radiation having a propagation direction and for generating an emitted radiation at an interaction region. A geometry shape of the gas nozzle is adapted to shape a profile of the gas flow such that gas density of the gas flow first increases to a maximum value and subsequently falls sharply in a cut-off region along the propagation direction.

According to another aspect of the disclosure there is provided a metrology apparatus comprising an illumination source as set out above.

According to another aspect of the disclosure there is provided an inspection apparatus comprising an illumination source as set out above.

According to another aspect of the disclosure there is provided a lithographic apparatus comprising an illumination source as set out above.

According to another aspect of the disclosure there is provided a lithographic cell comprising an illumination source as set out above.

BRIEF DESCRIPTION OF THE DRAWINGS

Embodiments will now be described, by way of example only, with reference to the accompanying schematic drawings, in which:

FIG. 6 depicts a simplified schematic drawing of an illumination source;

FIGS. 7A-7C depict FIG. 7A a schematic of an asymmetrical opening, FIG. 7B a gas density distribution plot and FIG. 7C profile plots of the gas flow;

FIGS. 8A-8C depict FIG. 8A a gas density distribution plot, FIG. 8B a schematic of gas nozzle and FIG. 8C profile plots of the gas flow;

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
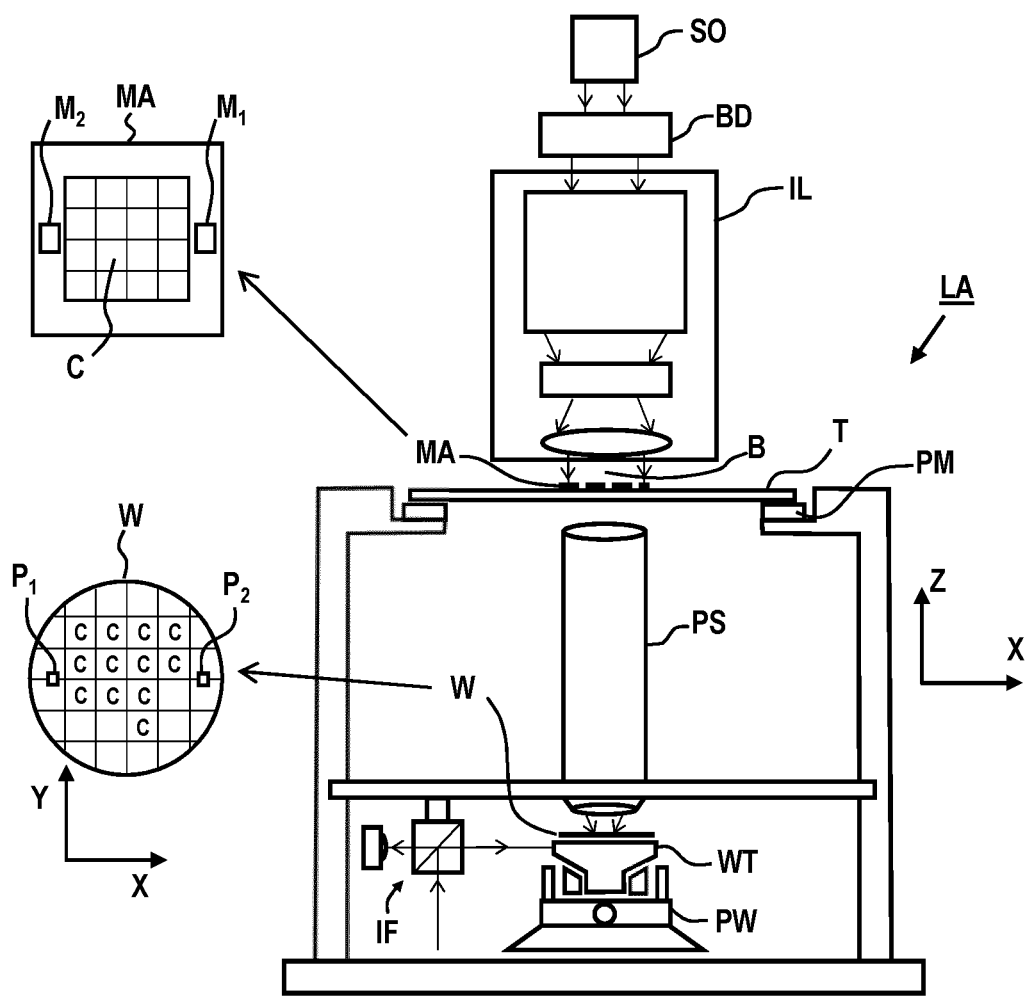
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W— which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
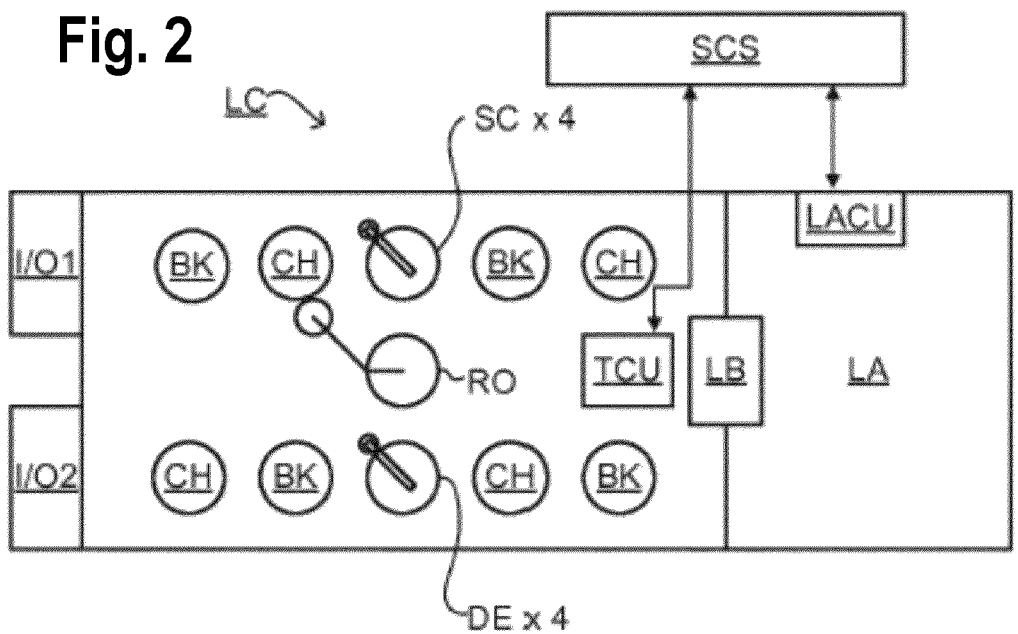
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, extreme ultraviolet and visible to near-IR wavelength range.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
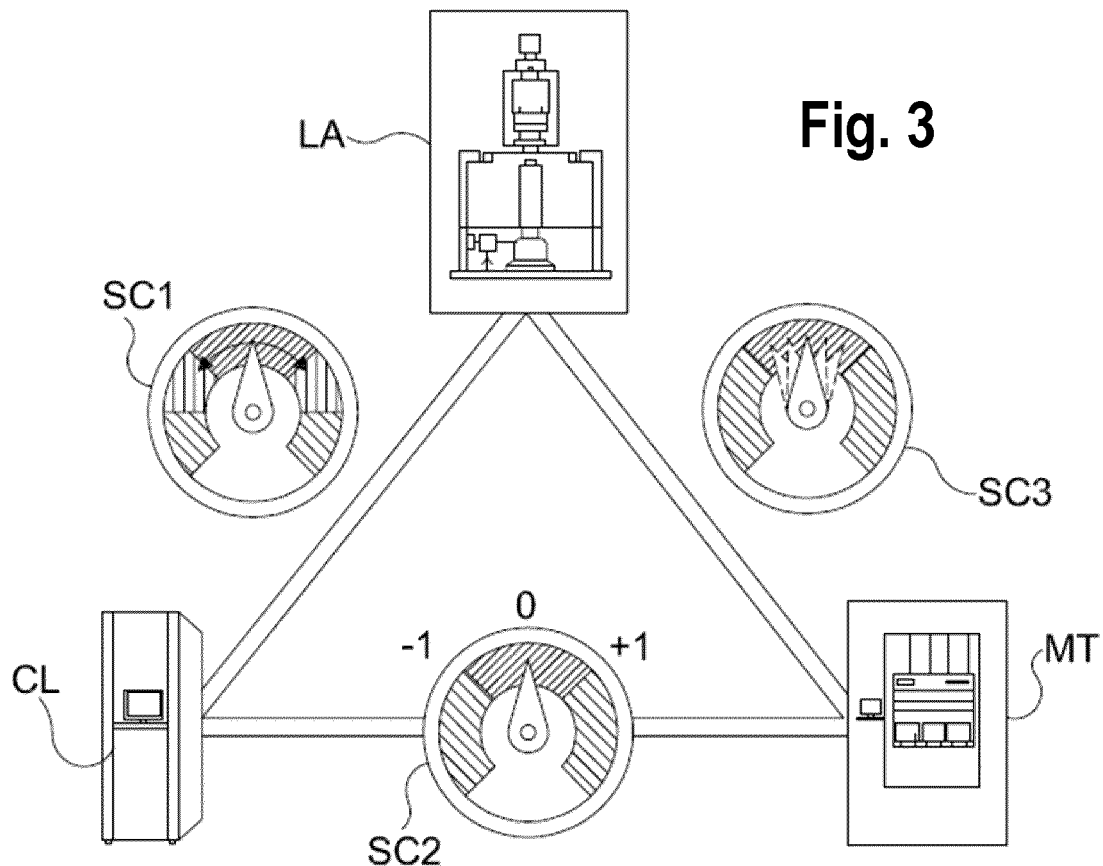
FIG. 3 depicts a schematic representation of holistic lithography, representing a cooperation between three key technologies to optimize semiconductor manufacturing.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from soft x-ray, extreme ultraviolet and visible to near-IR wave range.

Figure 4:
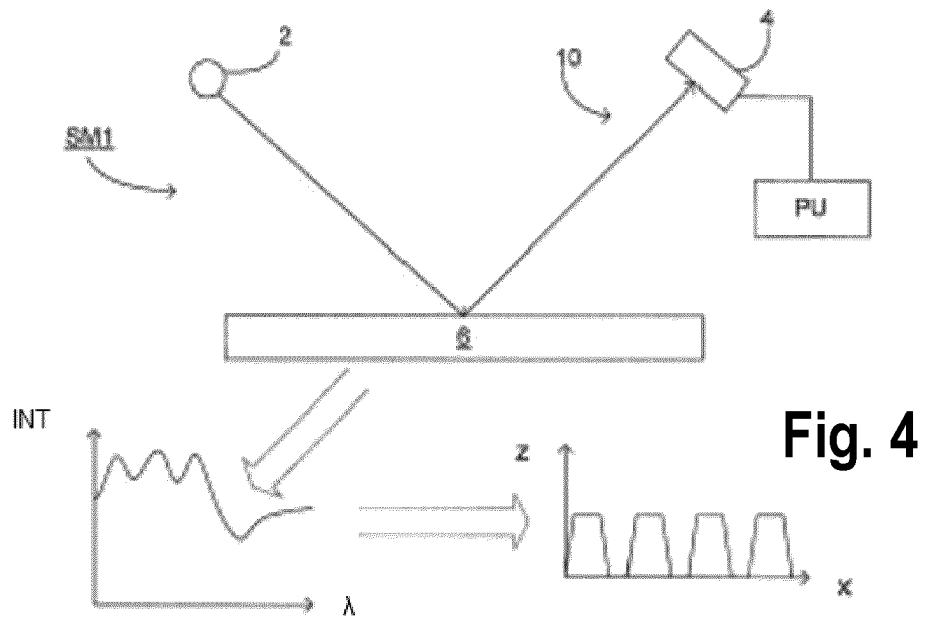
FIG. 4 schematically illustrates a scatterometry apparatus.

A metrology apparatus, such as a scatterometer, is depicted in FIG. 4. It comprises a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques may be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent application are incorporated herein by reference in their entirety.

Figure 5:
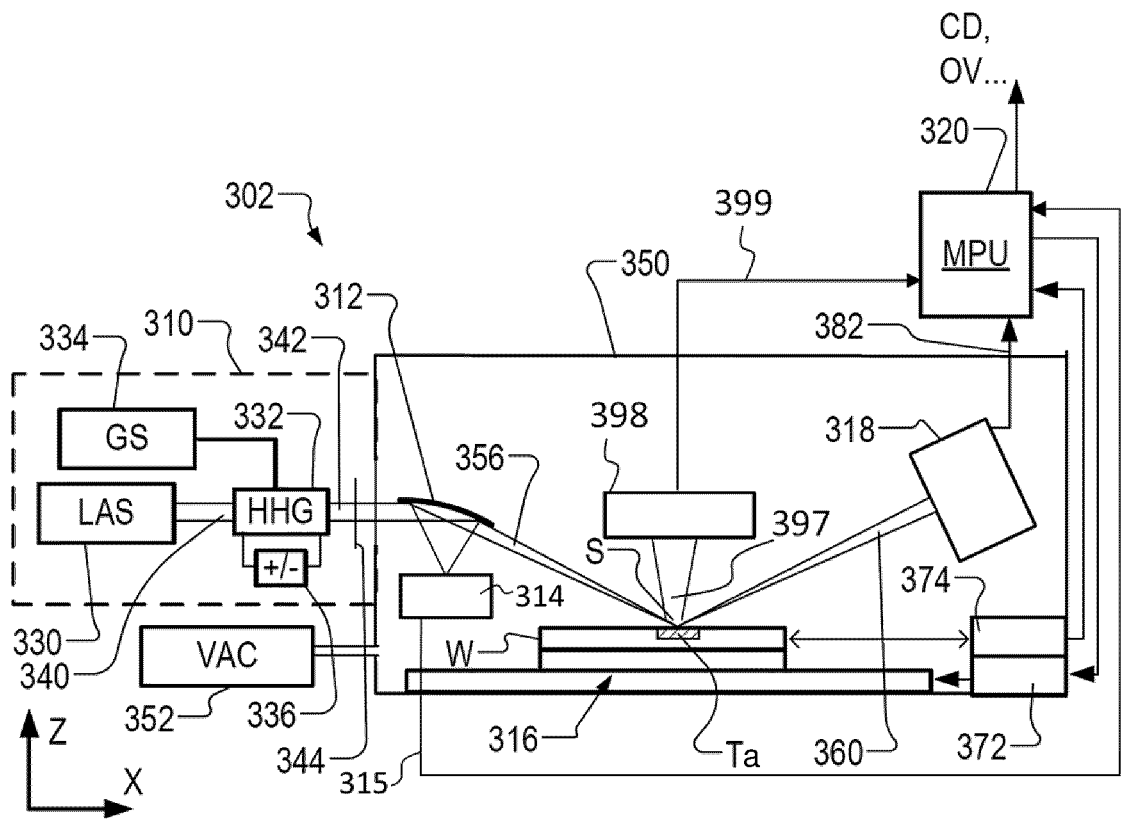
FIG. 5 depicts a schematic representation of a metrology apparatus in which EUV and/or SXR radiation is used.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV or soft x-ray radiation, which may be based on high harmonic generation (HHG) techniques. Main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 µm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube which will be discussed in the later text.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. A gas provided by the gas delivery system 332 defines a gas target, which may be a gas flow or a static volume. The gas may be for example a noble gas such as neon (Ne), helium (He) or argon (Ar). N2, O2, Ar, Kr, Xe gases may all be considered. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated. Some or all of the beam path may be contained within a vacuum or near vacuum environment, bearing in mind that SXR radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained vacuum or near vacuum by vacuum pump 352, so that EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 µm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). One of the challenges faced in the development of these sources is how to couple the emitted radiation out of the generating setup efficiently and separate the emitted radiation from the radiation used to drive the process.

FIG. 6 shows a simplified schematic drawing of an embodiment 600 of an illumination source 310, which may be the illumination source for high harmonic generation. One or more of the features of the illumination source in the metrology tool described with respect to FIG. 5 may also be present in the illumination source 600 as appropriate. The illumination source 600 comprises a chamber 601. The illumination source 600 is configured to receive a pump radiation 611 with a propagation direction which is indicated by an arrow. The pump radiation 611 shown here is an example of the pump radiation 340 from the pump radiation source 330, as shown in FIG. 5. The pump radiation 611 may be directed into the chamber 601 through the radiation input 605, which maybe a viewport which may be made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 615 may be a steady flow. Other media, such as metallic plasmas (e.g. aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 615 is provided by the gas delivery system into an evacuated or nearly evacuated space. The gas delivery system comprises a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B. CN101515105B is incorporated herein by reference in its entirety.

Comparing with using other gas delivery system, e.g. a gas-filled capillary, one example of which is described in e.g. "Single-shot fluctuations in waveguided high-harmonic generation", S. J. Goh et al, *Optics express*, 23(19), 24888, the advantage of using a gas nozzle, optionally with a cut tube or adapted geometry shape, is that alignment of the pump radiation and the gas target/flow is easier. While using gas-filled capillary, the gas delivery may be burned due to high power of the pump radiation if the alignment is not accurate enough.

The dimensions of the gas nozzle 609 may conceivably also be used in scaled-up or scaled-down versions ranging from micrometer-sized nozzles to meter-sized nozzles. This wide range of dimensioning comes from the fact that the setup should be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 5. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 5, to a wafer to be inspected for metrology measurements. The emitted radiation 613 may be guided, optionally focused, to a target on the wafer.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 5 into the radiation output 607, which is placed in the emitted beam path and that is opaque or nearly opaque to the driving radiation (e.g. opaque or nearly opaque to infrared or visible light) but at least partially transparent to the emitted radiation beam. The filter may be manufactured using zirconium. The filter may be a hollow, optionally an annular, block when the pump radiation 611 has a hollow, optionally an annular, transversal cross-sectional profile.

Described herein are methods, apparatuses, and assemblies to obtain emitted radiation optionally at a high harmonic frequency of pump radiation. The radiation generated through the process, optionally the HHG which uses non-linear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultraviolet (EUV), soft X-Ray (SXR), and/or hard X-Ray part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

The illumination source may be provided in for example a metrology apparatus MT, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

When the emitted radiation is generated by illuminating a radiation generating target (e.g. gas, plasma, or solid sample) by a pump radiation, typically conversion efficiency, which may be the ratio between the number of photons of the emitted radiation and the number of photons of the pump radiation, is small. Consequently, it is challenging to develop illumination sources that produce high output powers to enable metrology measurements with acceptably high output power. Therefore, to achieve a high output power, it may be essential to ensure that at least a portion of atoms in the radiation generating target emit their radiations at least partly coherently, which means that the electromagnetic waves which constitute the emitted radiation are in phase, which is called coherent emission. The benefit may be that the total intensity of emitted radiation by N radiating atoms is proportional to $N^2$ in case of coherent emission, which may result in a much higher total power than in the case that the atoms emit incoherently, for which the total intensity is proportional to N.

A condition for coherent emission may be that the electromagnetic waves constituting the pump radiation and the emitted radiation propagate through the radiation generating target at the same phase velocity (i.e. the velocity of wave crests), which is called phase matching. A focused beam naturally attains a higher phase velocity than an unfocused beam, so the pump radiation, which may be a focused radiation, naturally has a higher phase velocity than the emitted radiation, preventing coherent emission. To compensate for the difference in this natural wave velocities, the pump radiation may be slowed down by creating a sufficiently high refractive index in the target. This may be achieved by ensuring a sufficiently high gas pressure, which is called phase-matching pressure. The maximum value of the gas density of the gas flow may need to be above the phase-matching pressure to achieve high output power.

During the emitted radiation generation, optionally HHG, the gas flow may be partly ionized by the pump radiation and a plasma may be created. The effect of the plasma is to deteriorate the intensity distribution of the pump radiation by an effect called plasma defocusing, reducing the peak intensity which may be needed for the high output power and preventing the intensity distribution of the pump radiation which is needed for optimal emitted radiation quality. The strength of the plasma defocusing effect may grow with the gas pressure in the gas flow. However, as explained above, the gas pressure may be dictated by the requirement for the phase matching and cannot be chosen freely. Therefore, it is in general a challenge to provide both a sufficiently high gas pressure to ensure the phase matching, and a sufficiently low gas pressure to prevent the plasma defocusing effect. The typical result is often a trade-off where both are more or less acceptable, but neither is optimal, which means that one may reduce the gas pressure from optimal phase matching pressure to limit the plasma defocusing, leading to a reduced output power.

Figure 9A:
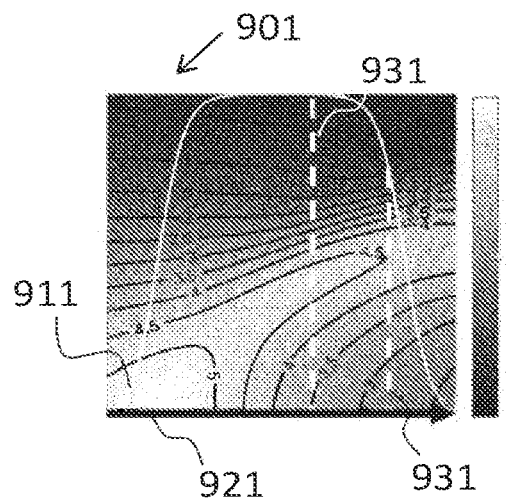
FIGS. 9A-9B depict both in FIG. 9A and FIG. 9B a radiation intensity distribution and a profile plot of the gas flow.

When a typical gas nozzle is used for gas delivery, which means that the gas nozzle has a cut tube geometry shape which has a uniform cylinder interior geometry shape, and the shape of the opening in the exit plane is round, the gas flow has a typical symmetrically or nearly symmetrically shaped profile along the propagation direction of the pump radiation, as can be seen in FIG. 9(a). FIG. 9(a) shows a simulated intensity distribution 901 in grayscale of a pump radiation, which is a laser beam in this example, propagating from left to right (in the direction of an arrow 921) through a neon gas with a typical symmetrically shaped gas flow profile. It means that a gas profile 911 is such that gas density of the gas flow, which is indicated with P axis, is symmetrical along the propagation direction which is indicated with X axis. For the gas profile 911 the P axis indicates the gas density while for the intensity distribution in grayscale the P axis indicates a radial direction of the pump radiation which is perpendicular to the propagation direction. The dark colour in the plot 901 indicates low pump radiation intensity while light colour indicates high pump radiation intensity. The arrow 921 indicates central axis and the propagation direction of the pump radiation. Two vertical dashed lines 931 indicate a region of the gas flow 615 along the pump radiation propagation direction, which contributes most of the emitted radiation. The gas flow 615 between the two dash lines 931 may be called the interaction region.

With the symmetrical gas profile 911, the plasma defocusing causes the majority of the pump radiation, optionally the pump laser radiation, to move away from the axis 921, restricting the highest pump radiation intensity to only the first part of the gas flow (white area). Besides, the plasma defocusing causes a reduction of the intensity in the gas region between the dashed lines, which most significantly contributes to the output power. The simulated example shows that the plasma formation in a gas flow significantly reduces the peak laser intensity and restricts the high-intensity region of the pump radiation only to an upstream side of the gas flow, which is, in the examples shown in FIG. 9, left part of the gas flows. Therefore the plasma defocusing affects the output power.

The properties of the emitted radiation may be tailored by changing a profile of the gas flow or called gas profile or called gas flow profile, optionally the gas density of the gas flow along the propagation direction. The profile of the gas flow may be to suppress an energy divergence of the pump radiation inside the gas flow, wherein the energy divergence is caused by the fact that a portion of the gas flow is ionized by the pump radiation, optionally by the plasma defocusing effect. The profile of the gas flow may be shaped by adapting the geometry shape of the gas nozzle. For example, the shape of the opening in the exit plane typically is symmetric to planes perpendicular to the propagation direction of the pump radiation, which generates a gas flow with the symmetrical or nearly symmetrical profile along the propagation direction, e.g. the gas profile 911 in FIG. 9(a). The shape of the opening in the exit plane may also be made asymmetric to planes perpendicular to the propagation direction of the pump radiation, which is called an asymmetrical opening, for example an opening 701 in FIG. 7(a), which will be discussed in later text. The asymmetric opening may generate a gas flow with an asymmetrical shape along the propagation direction, for example gas profiles 719, 729, and 739 in FIG. 7(c), which will also be discussed in later text. The asymmetrical profile of the gas density of the gas flow which may be due to the asymmetrical opening, may remove or suppress the plasma defocusing effect with a sufficiently high gas pressure, optionally above the phase-matching pressure, and result in a higher output power, optionally with a better radiation quality.

Besides adapting the shape of the opening in the exit plane, other parameters of geometry shape of the gas nozzle may also be adapted to shape a profile of the gas flow. Optionally an internal cross-sectional area of the gas nozzle in a plane parallel to the exit plane may be adapted. Optionally the internal cross-sectional area may increase, optionally linearly increase, along direction of the gas flow for at least a portion of the gas nozzle. Optionally the illumination source may comprise an adjustable element for altering the profile of the gas flow. Optionally the adjustable element may be for altering the profile of the gas flow during generating the emitted radiation. Optionally the above-mentioned parameters of geometry shape of the gas nozzle may be adapted combined.

Figure 10A:
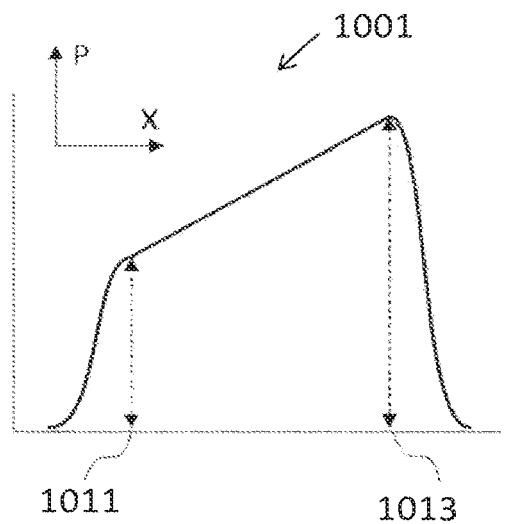
FIGS. 10A-10B depict FIG. 10A a schematic of the gas profile and FIG. 10B a plot of output power of the emitted radiation.

One example of the impact of the gas flow profile on the output power of the emitted radiation is simulated in FIG. 10. The gas flow length and pump radiation are fixed. FIG. 10(a) shows a schematic of the gas pressure profile along the propagation direction X. The vertical axis P indicates the pressure or gas density of the gas flow. Two vertical lines and indicate the gas density at two specific locations on the gas profile, which are called a first pressure and a second pressure, respectively. Along the propagation direction X, the gas density gradually increases before the first pressure 1011, and gradually decreases after the second pressure 1013. The gas density changes in a linear way in between the first pressure 1011 and second pressure 1013. Note that the linear change in between the first pressure 1011 and second pressure 1013 is just for simplifying the simulation while in practice the change of the gas density in between these two vertical lines does not need to be linear. Note that the shape of the gas profile simulated is just an example, while in practice the profile of the gas flow may have other shapes.

Figure 9B:
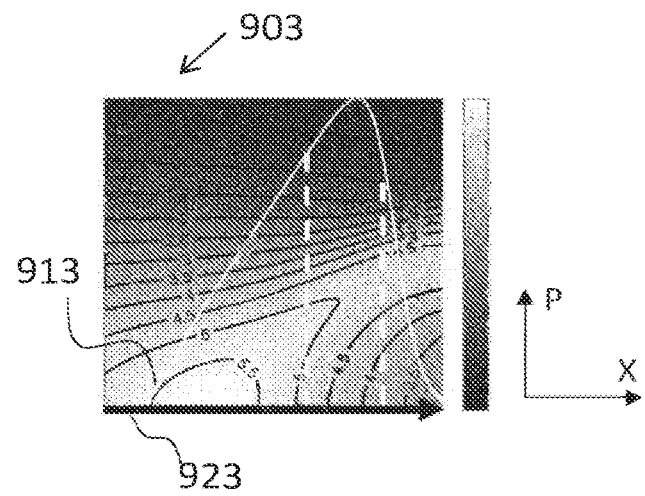
Figure 10B:
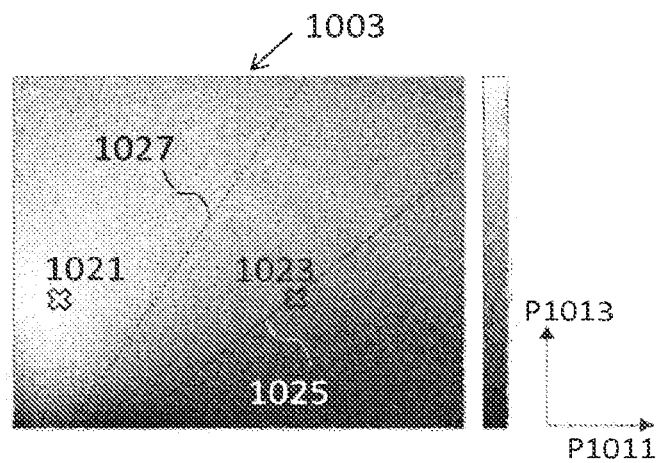

During the simulation, the first pressure and second pressure vary independently over a group of different values and the resulting output power of the emitted radiation as function of first and second pressure, indicated by axes P1013 and P1011, is shown in grayscale plot of the output power 1003, as shown in FIG. 10(b). The dark colour in the plot 1003 indicates low output power while light colour indicates high output power. The solid line 1025 indicates first and second pressure pairs where first and second pressures are equal, e.g. the gas flow with a typical symmetrically shaped profile 911 along the propagation direction in FIG. 9(a). The dashed line 1027 indicates cases where the first pressure has half the second pressure. The two examples 901 and 903 in FIGS. 9(a) and (b) are indicated with crosses 1023 and 1021 respectively. As seen in the simulation result in FIG. 9(b), the highest output powers are obtained in the region close to the y-axis, i.e. in where the first pressure is relatively low.

FIG. 9(b) shows a comparison simulation of the simulation in FIG. 9(a), showing the pump radiation intensity distribution 903 with an asymmetrically shaped gas flow profile 913, where the gas density of the gas flow first increases to a maximum value and subsequently falls sharply in a cut-off region along the propagation direction. Along the propagation direction, the interaction region may be followed by a sharp cut-off region in order to reduce the re-absorption of emitted radiation by the gas flow. Optionally, the cut-off region length of the profile of the gas flow in the propagation direction of the pump radiation is less than 500 µm. Optionally, the cut-off region length of the profile of the gas flow in the propagation direction of the pump radiation is less than 200 µm. Optionally, the cut-off region length of the profile of the gas flow in the propagation direction of the pump radiation is less than 100 µm. Optionally, the cut-off region length of the profile of the gas flow in the propagation direction of the pump radiation is less than 50 µm. An arrow 923 indicates central axis and the propagation direction of the pump radiation. Two vertical dashed lines 933 indicate a region of the gas flow 615 along the pump radiation propagation direction, which contributes most to the emitted radiation. The gas flow 615 between the two dash lines 933 may be called the interaction region. The maximum gas pressure here is the same as the one in FIG. 9(a).

It will be appreciated that the gas flow profile 913 is exemplary only so as to illustrate the principles of the present disclosure. In practice any similar gas flow profile, e.g. with a bump or twist, may has similar effect, and many specific implementations may be envisaged in accordance with the principles of the present disclosure.

In FIG. 9(b), the plasma defocusing effect is smaller compared with in FIG. 9(a), because of the lowered upstream gas pressure. As a result, the high-intensity region (bright area) extends into a downstream part of the gas flow profile, which is, in the examples shown in FIG. 9, right part of the gas flows, leading to higher output power of the emitted radiation. In this simulation, the asymmetrical gas profile in FIG. 9(b) leads to an increase in total output power by around 50% compared to the case in FIG. 9(a) with a symmetrical gas profile.

The effects of plasma defocusing may be most significant when it takes place in the upstream part because that the pump radiation then may be affected over the full length of the gas flow. In contrast, good phase matching may matter most in the downstream part of the gas because the emitted radiation there contributes the majority of the total output power and that the emitted radiation from the downstream part of the gas profile is least reabsorbed. In one embodiment the profile of the gas flow is shaped such that the pressure at the downstream side is optimized for optimal phase matching and hence optimal output power, while the pressure at the upstream side is lowered to reduce plasma defocusing effects. In this way, the conflicting requirements of high pressure for the phase matching on the one hand and low pressure for reduction of the plasma defocusing on the other hand may be at least to a certain extent separated by applying them to different parts of the profile of the gas flow.

As mentioned above, the above-mentioned profile of the gas flow, where the gas density of the gas flow first increases to a maximum value and subsequently falls sharply in the cut-off region along the propagation direction, may be obtained by using a gas nozzle with adapted geometry shape. In one embodiment, width of the opening gradually increases along the propagation direction of the pump radiation.

Optionally the shape of the opening is a trapezoid.

FIG. 7(a) shows schematic of one example 701 where the shape of the opening 711 is a trapezoid, more specifically an isosceles trapezoid. The axis X indicates the propagation direction of the pump radiation. The axis Y indicates one of the other directions in the exit plane which is perpendicular to X. The axis Z indicates the direction perpendicular to the exit plane and has an acute angle with the gas flow direction. In an embodiment, a length of a first side 725 is 50 µm and a length of a second side 723 is one of 400 µm, 200 µm, and 100 µm, in which case a shape of the opening in the exit plane is asymmetric to planes perpendicular to the propagation direction of the pump radiation. The second side 723 of 50 µm is also simulated as reference. The length of the opening 721 along the pump radiation propagation direction is 500 µm.

The corresponding simulated gas density distribution plot 715 and profile plots 703 along the propagation direction of the gas flow based on the opening 711 in FIG. 7(a) are shown in FIG. 7(b) and FIG. 7(c) respectively. In FIG. 7(b), a schematic block 713 represents part of the gas nozzle 609 with the opening 701 in its exit plane, which is the bottom side of the block. The length of the second side 723 is 400 µm in this example.

The plot 703 comprise gas profiles 719, 729, 739 and 749 with the lengths of second side of 400 µm, 200 µm, 100 µm, and 50 µm, respectively. The vertical axis P indicates the gas density. As can be seen, when the second side 723 is larger than the first side 725, the gas profiles have asymmetrical shapes along the propagation direction and the gas densities of the gas flow first increases to a maximum value and subsequently falls sharply in a cut-off region along the propagation direction, which is indicated by X.

It will be appreciated that the trapezoid shape is exemplary only so as to illustrate the principles of the present disclosure. In practice any shape which has a width of the opening gradually increasing along the propagation direction of the pump radiation may generate a similar profile, and many specific implementations may be envisaged in accordance with the principles of the present disclosure.

As mentioned above, the internal cross-sectional area of the gas nozzle in a plane parallel to the exit plane may be adapted, optionally together with an adjustable element, to alter the profile of the gas flow, as the embodiment shown in FIG. 8. As can be seen in a schematic of gas nozzle 803 in FIG. 8(b), the internal surface 815 of the gas nozzle change in such a way that the internal cross-sectional area increases, optionally linearly increases, along direction of the gas flow for at least a portion of the gas nozzle. The portion of the gas nozzle with increasing internal cross-sectional area, which may be called as diverging, may result in a gas expansion, a decrease of gas density and/or an increase of gas flow velocity. With an adapted geometry shape of the gas nozzle, as shown in FIG. 8(b), the volume of the gas flow has a sharper boundary compared to one without diverging, which may help for e.g. generating a relatively small cut-off region length. In the schematic of gas nozzle 803 in FIG. 8(b), the internal cross-sectional area of the gas nozzle is symmetrical along the gas flow direction before exiting the opening, but in practice an internal cross section of the gas nozzle may also be asymmetrical to planes perpendicular to the propagation direction of the pump radiation, which may create the asymmetrically shaped gas flow profile e.g. as the gas flow profile 913 in FIG. 9(b). In one embodiment, the internal cross section of the gas nozzle has the same shape as the embodiment of the opening 711 in FIG. 7(a), which is asymmetrical to planes perpendicular to the propagation direction of the pump radiation, e.g. a plane comprising axes Y and Z.

The example of the gas nozzle 803 may comprise an adjustable element 813. FIGS. 8(a) and 8(b) show a cross-section of the adjustable element 813. The adjustable element 813 is, for example, wedge shaped. It is to be noted that the adjustable element 813 may have other shapes as well. As illustrated in FIG. 8(b), the adjustable element 813, which may be positioned in between the exit plane and the pump radiation, may further alter the profile of the gas flow. The adjustable element 813 may be configured for being positioned at least partly in the gas flow. After exiting the exit plane, the gas flow may impact on the adjustable element with one of its surfaces inclined towards the gas flow direction. The gas flow streams out through the gas nozzle, optionally with the increasing internal cross-sectional area, and may be compressed by the adjustable element 813 that is placed after the exit plane of the gas nozzle. The adjustable element may shape the gas flow profile and may result in a shock wave, which is indicated by the white arrows and dash lines in FIG. 8(b). The shock wave may compress the gas flow into a high-density region near the adjustable element 813, which is indicated by area inside the dash ellipse in FIG. 8(b). The region between the adjustable element 813 and shock wave may have a higher density and there may be a sharp change in density across the shock wave. Since the length of the shock wave along the pump radiation propagation direction is a few tens of microns, relatively small cut-off region length, optionally cut-off region length less than 100 µm, in the propagation direction of the pump radiation may be achieved. After impacting on the adjustable element, the gas flow with an altered profile will further expand to the surrounding, which may be vacuum or near vacuum.

Optionally, the position of the adjustable element with respect to the gas flow is adjustable. The adjustable element may be tuned in both rotational and translational directions to optimize the emitted radiation during generation process of the emitted radiation. Tuning the adjustable element may shape the profile of the gas flow, which may further change characteristics of the emitted radiation, optionally further optimize the characteristics of the emitted radiation.

In FIGS. 8(a) and (b), the adjustable element is placed after the exit plane along the gas flow direction, while in practice it may also be place before exiting the exit plane and be part of the internal surface of the gas nozzle, which may shape the profile of the gas flow such that gas density of the gas flow first increases to a maximum value and subsequently falls sharply in a cut-off region along the propagation direction, similar as shown in FIG. 8(c).

FIG. 8(a) shows a simulated gas density distribution plot 801 in grayscale with the gas nozzle 811 and the adjustable element 813. The axis X indicates the propagation direction of the pump radiation. The axis Y indicates one of other directions in the exit plane which is perpendicular to X. The axis Z indicates a direction perpendicular to the exit plane and has an acute angle with the gas flow direction. The gas density distribution is in grayscale where dark colour in the plot indicates low gas density while light colour indicates high gas density. A position of the shock wave is shown as a sharp change in the gas density. In this embodiment, the diverging is in the Y direction. Note that the diverging does not need to have a symmetric cross-sectional area in planes parallel to the exit plane.

One example of the pump radiation 817 propagates through the altered gas flow with propagation direction as indicated by a black arrow in FIG. 8(b). The gas density measured along the propagation direction may have the profiles for which the gas density of the gas flow first increases to a maximum value and subsequently falls sharply in a cut-off region along the propagation direction. FIG. 8(c) shows the simulated gas profiles along the propagation direction with varying distances from the adjustable element. For the gas profile examples 821, 823 and 825, the distances from the adjustable element are 300 µm, 400 µm and 500 µm respectively. As can be seen, the gas density of the gas flow first increases to a maximum value, and subsequently falls sharply in a cut-off region along the propagation direction. In one embodiment, there may be a bump or called twist in the gas profile on the upstream side and/or downstream side of the gas flow, which zigzag the gas profile. The bump may be due to a boundary effect caused by the adjustable element.

It will be appreciated that the shapes of the above-mentioned gas profiles are exemplary only so as to illustrate the principles of the present disclosure, and that many specific implementations may be envisaged in accordance with the principles of the present disclosure.

An additional benefit of this embodiment in FIG. 8 is that it enables to make an optimal gas profile at some significant distance from the nozzle, optionally 400 µm, rather than being forced into a suboptimal compromise between being as close as possible to the nozzle for e.g. good profile on the one hand, and sufficiently far from the nozzle to avoid e.g. damage and laser clipping on the other hand.

Figure 11:
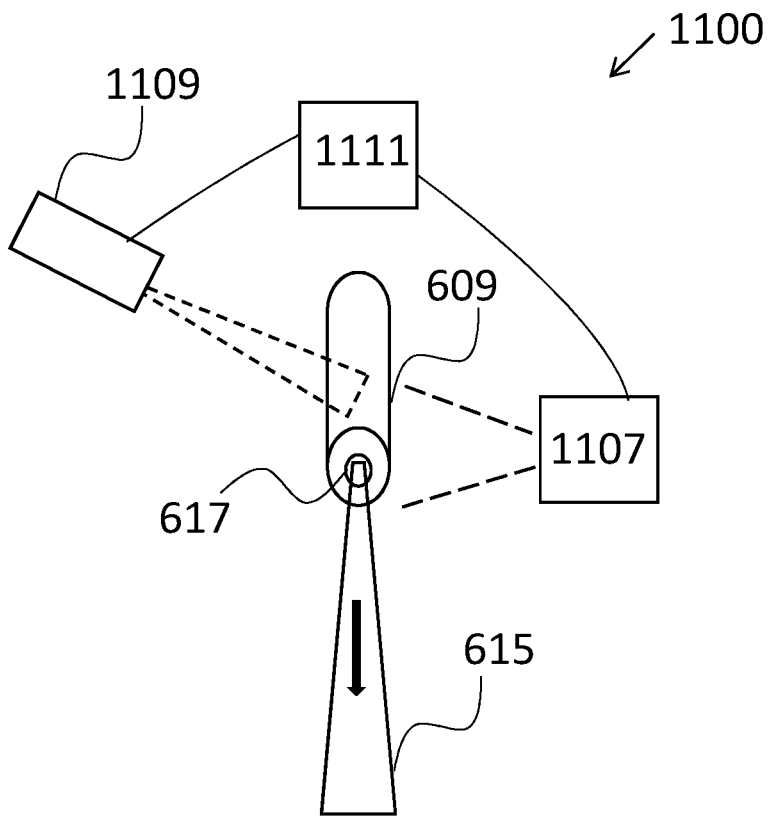
FIG. 11 schematically illustrates a gas delivery system with temperature controlling assembly.

Compared with using a gas shaping element comprises an aperture to transmit the generated measurement radiation, one embodiment of which is illustrated in FIG. 11 of patent application WO2018/166741A1, advantage of using the adjustable element 813 is that alignment of the pump radiation is easier when the adjustable element 813 is positioned in between the exit plane and the pump radiation. While using the embodiment in WO2018166741A1, the gas shaping element may easily get burned due to high power of the pump radiation if accurate alignment, which is challenging herein, is not obtained. WO2018/166741A1 is incorporated herein by reference in its entirety.

Besides the embodiments mentioned above, a system of two gas jets with two different gases may also generate similar gas profile, one example of which is illustrated in FIG. 16 of patent application WO2018/166741A1. Compared with the system of two gas jets, advantage of using the adapted gas nozzle is that the optimization of the emitted radiation is easier due to uniform gas composition of the gas flow and that the vacuum or near vacuum atmosphere within inspection chamber 350 is easier to be maintained.

During the generation process of the emitted radiation, the gas nozzle may be exposed to both cooling effect and heating effect at the same time. The gas flow exiting the opening may have a low temperature, optionally around 200 K, due to acceleration and rapid expansion, which may cool the gas nozzle. For a 3 mm gas nozzle made of Nickel, shrinkage along the gas nozzle direction may be around 20 µm, which is non-negligible compared to distance between the pump radiation and the gas nozzle, e.g. 50-100 µm and focal spot diameter of the pump radiation e.g. 20-30 µm. On the other hand, the pump radiation may have a high intensity at/near the interaction region and may heat up or even burn the gas nozzle, which depends on the distance between the pump radiation and the gas nozzle. During the generation process of the emitted radiation, relative position between the pump radiation and the gas nozzle may be adjusted to optimize the emitted radiation. The combination of the heating effect and cooling effect may introduce additional thermal expansion/shrinkage of the gas nozzle along the gas flow direction, and since the gas profile may vary along the gas flow direction, it may result in a drift in the emitted radiation. Furthermore, a switching on and/or off of the gas flow during the process may also introduce the drift.

FIG. 11 schematically illustrates a gas delivery system, optionally of an illumination source, with a temperature controlling assembly. The temperature controlling assembly may comprise a temperature controlling element 1109, which may be used to change a temperature of at least part of the gas nozzle 609 or maintain the temperature near a desired setpoint. Optionally the temperature controlling element 1109 may be a source emitting electromagnetic radiation, optionally a laser, or a heating element, optionally a heating wire. Optionally the temperature controlling element 1109 may be a cooling element, e.g. a thermoelectric cooler or a liquid cooling system. Optionally the temperature controlling element 1109 may be a thermostat maintaining the at least part of the gas nozzle near a desired setpoint.

The temperature controlling assembly may comprise a temperature controlling detector 1107, which may detect change of the temperature or the geometry shape of the gas nozzle. Optionally, the temperature controlling detector 1107 may be a camera. A camera may use inferred measurement for temperature detection and/or detect shape difference. Optionally, the temperature controlling detector 1107 may be a temperature sensor such as a thermometer. The signal obtained by the temperature controlling detector 1107 may be transferred to a temperature controlling processor 1111. Based on the signal received, the temperature controlling processor 1111 may communicate with the temperature controlling element 1109 to control the temperature of the at least part of the gas nozzle, which may called a feedback control loop.

Figure 12:
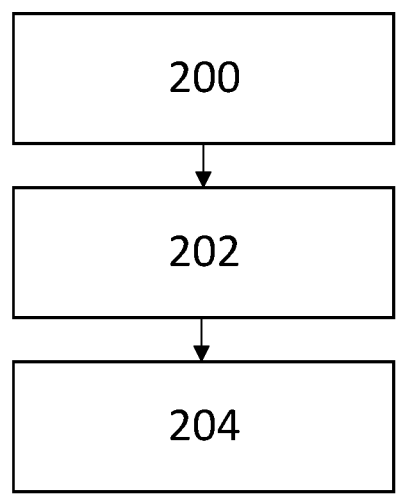
FIG. 12 comprises a flow diagram of steps in a method of generating an emitted radiation.

All the above-mentioned embodiments may be used in methods for generating radiation with an illumination source, as depicted in FIG. 12. A first step 200 is delivering a gas flow 615 in an illumination source comprising with providing a gas flow from an opening 617 in an exit plane of a gas nozzle 609 for receiving a pump radiation having a propagation direction and for generating an emitted radiation at an interaction region. In the method, a geometry shape of the gas nozzle may be adapted to shape a profile of the gas flow such that gas density of the gas flow first increases to a maximum value and subsequently falls sharply in a cut-off region along the propagation direction. Optionally there may be a second step 202, which is providing a pump radiation 611 which has a propagation direction in the gas flow 615. Optionally there may be a third step 204, which is generating an emitted radiation at an interaction region. More details on methods of generating radiation with an illumination source are provided in the description of the embodiments described in relation to figures and texts above.

Further embodiments are disclosed in the subsequent numbered clauses:

1. An illumination source comprising
   a gas delivery system comprising a gas nozzle, wherein the gas nozzle comprising an opening in an exit plane of the gas nozzle,
   wherein the gas delivery system being configured to provide a gas flow from the opening for generating an emitted radiation at an interaction region,
   wherein the illumination source being configured to receive a pump radiation having a propagation direction and to provide the pump radiation in the gas flow,
   wherein a geometry shape of the gas nozzle is adapted to shape a profile of the gas flow such that gas density of the gas flow first increases to a maximum value and subsequently falls sharply in a cut-off region along the propagation direction.
2. An illumination source according to clause 1, wherein the profile of the gas flow is to suppress an energy divergence of the pump radiation inside the gas flow, wherein the energy divergence is caused by the fact that a portion of the gas flow is ionized by the pump radiation.
3. An illumination source according to clause 1 or 2, wherein the maximum value is above a phase-matching pressure.
4. An illumination source according to any preceding clause, wherein a cut-off region length of the profile of the gas flow in the propagation direction of the pump radiation is less than 100 µm.
5. An illumination source according to any preceding clause, wherein a shape of the opening in the exit plane is asymmetric to planes perpendicular to the propagation direction of the pump radiation.
6. An illumination source according to any preceding clause, wherein width of the opening gradually increases along the propagation direction of the pump radiation.
7. An illumination source according to clause 5 or 6, wherein the shape of the opening is a trapezoid.
8. An illumination source according to clause 7, wherein shape of the opening is an isosceles trapezoid.
9. An illumination source according to any preceding clause, wherein an interior cross-sectional area of the gas nozzle in a plane parallel to the exit plane increases along direction of the gas flow for at least a portion of the gas nozzle.
10. An illumination source according to any preceding clause, wherein the illumination source comprises an adjustable element for altering the profile of the gas flow.
11. An illumination source according to clause 10, wherein the adjustable element is for altering the profile of the gas flow during generating the emitted radiation.
12. An illumination source according to clause 10 or 11, wherein the adjustable element is configured for being positioned at least partly in the gas flow.
13. An illumination source according to any preceding clause, wherein the illumination source comprises a pump radiation source operable to emit the pump radiation.
14. An illumination source according to any preceding clause, wherein the illumination source is for high harmonic generation.

15. An illumination source according to any preceding clause, wherein the gas flow is provided by the gas delivery system into an evacuated or nearly evacuated space.

16. An illumination source according to any preceding clause, wherein the emitted radiation has a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

17. An illumination source according to any preceding clause, wherein in operation the emitted radiation is guided to a target on a wafer.

18. An illumination source according to any preceding clause, wherein the emitted radiation is for metrology measurements.

19. An illumination source according to any preceding clause, wherein the illumination source comprising a temperature controlling assembly.

20. A metrology apparatus comprising an illumination source according to any of clauses 1 to 19.

21. A lithographic cell comprising an illumination source according to any of clauses 1 to 19.

22. A method of delivering gas in an illumination source comprising
    providing a gas flow from an opening in an exit plane of a gas nozzle for receiving a pump radiation having a propagation direction and for generating an emitted radiation at an interaction region; wherein a geometry shape of the gas nozzle is adapted to shape a profile of the gas flow such that gas density of the gas flow first increases to a maximum value and subsequently falls sharply in a cut-off region along the propagation direction.

23. An illumination source comprising
a gas delivery system comprising a gas nozzle, wherein the gas nozzle comprising an opening in an exit plane of the gas nozzle, wherein the gas delivery system being configured to provide a gas flow from the opening for generating an emitted radiation at an interaction region, and
an adjustable element for altering a profile of the gas flow, wherein the illumination source being configured to receive a pump radiation having a propagation direction and to provide the pump radiation in the gas flow,
wherein the adjustable element is positioned in between the exit plane and the pump radiation.

24. An illumination source according to clause 23, wherein the profile of the gas flow is such that gas density of the gas flow first increases to a maximum value and subsequently falls sharply in a cut-off region along the propagation direction.

25. An illumination source according to clause 24, wherein the maximum value is above a phase-matching pressure.

26. An illumination source according to any preceding clause, wherein the profile of the gas flow is to suppress an energy divergence of the pump radiation inside the gas flow.

27. An illumination source according to clause 26, wherein the energy divergence is caused by the fact that a portion of the gas flow is ionized by the pump radiation.

28. An illumination source according to any preceding clause, wherein the adjustable element is for altering the profile of the gas flow during generating the emitted radiation.

29. An illumination source according to any preceding clause, wherein the adjustable element is configured for being positioned at least partly in the gas flow.

30. An illumination source according to any preceding clause, wherein a cut-off region length of the profile of the gas flow in the propagation direction of the pump radiation is less than 100 µm.

31. An illumination source according to any preceding clause, wherein a shape of the opening in the exit plane is asymmetric to planes perpendicular to the propagation direction of the pump radiation.

32. An illumination source according to any preceding clause, wherein width of the opening gradually increases along the propagation direction of the pump radiation.

33. An illumination source according to clause 31 or 32, wherein the shape of the opening is a trapezoid.

34. An illumination source according to clause 33, wherein the shape of the opening is an isosceles trapezoid.

35. An illumination source according to any preceding clause, wherein an interior cross-sectional area of the gas nozzle in a plane parallel to the exit plane increases along direction of the gas flow for at least a portion of the gas nozzle.

36. An illumination source according to any preceding clause, wherein the illumination source comprises a pump radiation source operable to emit the pump radiation.

37. An illumination source according to any preceding clause, wherein the illumination source is for high harmonic generation.

38. An illumination source according to any preceding clause, wherein the gas flow is provided by the gas delivery system into an evacuated or nearly evacuated space.

39. An illumination source according to any preceding clause, wherein the emitted radiation has a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

40. An illumination source according to any preceding clause, wherein in operation the emitted radiation is guided to a target on a wafer.

41. An illumination source according to any preceding clause, wherein the emitted radiation is for metrology measurements.

42. An illumination source according to any preceding clause, wherein the illumination source comprising a temperature controlling assembly.

43. An illumination source according to any preceding clause, wherein the pump radiation comprises pulses.

44. A metrology apparatus comprising an illumination source according to any of clauses 23 to 43.

45. A lithographic cell comprising an illumination source according to any of clauses 23 to 43.

46. A method of delivering gas in an illumination source comprising
providing a gas flow from an opening in an exit plane of a gas nozzle for receiving a pump radiation having a propagation direction and for generating an emitted radiation at an interaction region, and
altering a profile of the gas flow with an adjustable element, wherein the adjustable element is positioned in between the exit plane and the pump radiation.

47. An illumination source comprising
    a gas delivery system comprising a gas nozzle, wherein the gas nozzle comprising an opening in an exit plane of the gas nozzle,
    wherein the gas delivery system being configured to provide a gas flow from the opening for generating an emitted radiation at an interaction region, wherein the illumination source being configured to receive a pump radiation having a propagation direction and to provide the pump radiation in the gas flow, wherein a shape of the opening in the exit plane is asymmetric to planes perpendicular to the propagation direction of the pump radiation.

48. An illumination source according to clause 47, wherein a geometry shape of the gas nozzle is adapted to shape a profile of the gas flow such that gas density of the gas flow first increases to a maximum value and subsequently falls sharply in a cut-off region along the propagation direction.

49. An illumination source according to clause 48, wherein the profile of the gas flow is to suppress an energy divergence of the pump radiation inside the gas flow.

50. An illumination source according to clause 49, wherein the energy divergence is caused by the fact that a portion of the gas flow is ionized by the pump radiation.

51. An illumination source according to any of clauses 48 to 50, wherein the maximum value is above a phase-matching pressure.

52. An illumination source according to any of clauses 48 to 51, wherein a cut-off region length of the profile of the gas flow in the propagation direction of the pump radiation is less than 100 μm.

53. An illumination source according to any preceding clause, wherein width of the opening gradually increases along the propagation direction of the pump radiation, optionally the shape of the opening is a trapezoid, optionally the shape of the opening is an isosceles trapezoid.

54. An illumination source according to any preceding clause, wherein an interior cross-sectional area of the gas nozzle in a plane parallel to the exit plane increases along direction of the gas flow for at least a portion of the gas nozzle.

55. An illumination source according to any preceding clause, wherein the illumination source comprises an adjustable element for altering the profile of the gas flow.

56. An illumination source according to clause 55, wherein the adjustable element is for altering the profile of the gas flow during generating the emitted radiation.

57. An illumination source according to clause 54 or 55, wherein the adjustable element is configured for being positioned at least partly in the gas flow.

58. An illumination source according to any preceding clause, wherein the gas flow is provided by the gas delivery system into an evacuated or nearly evacuated space.

59. An illumination source according to any preceding clause, wherein the emitted radiation has a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

60. An illumination source according to any preceding clause, wherein the illumination source comprising a temperature controlling assembly.

61. A metrology apparatus or a lithographic cell comprising an illumination source according to any of clauses 47 to 60.

62. A method of delivering gas in an illumination source comprising
providing a gas flow from an opening in an exit plane of a gas nozzle for receiving a pump radiation having a propagation direction and for generating an emitted radiation at an interaction region; wherein a shape of the opening in the exit plane is asymmetric to planes perpendicular to the propagation direction of the pump radiation.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range between 0.01 nm and 10 nm, or optionally between 0.01 nm and 0.2 nm, or optionally between 0.1 nm and 0.2 nm, for metrology measurements.

The invention claimed is:

1. An illumination source comprising:
   a gas delivery system comprising a gas nozzle, and wherein the gas nozzle comprises an opening in an exit plane of the gas nozzle, wherein the gas delivery system is configured to provide a gas flow from the opening operable to generate an emitted radiation at an interaction region, and
   a gas shaping element disposed entirely between the exit plane and a pump radiation having a propagation direction and configured to alter a profile of the gas flow,
   wherein the illumination source is configured to receive the pump radiation and to provide the pump radiation in the gas flow.

2. The illumination source of claim 1, wherein a geometrical shape of the gas nozzle is adapted to shape the profile of the gas flow, such that a gas density of the gas flow first increases to a maximum value and subsequently falls sharply in a cut-off region along the propagation direction.

3. The illumination source of claim 2, wherein:
   the profile of the gas flow is to suppress an energy divergence of the pump radiation inside the gas flow, and
   the energy divergence is caused by a portion of the gas flow being ionized by the pump radiation.

4. The illumination source of claim 2, wherein the maximum value is above a phase-matching pressure.

5. The illumination source of claim 2, wherein a cut-off region length of the profile of the gas flow in the propagation direction of the pump radiation is less than 100 μm.

6. The illumination source of claim 1, wherein:
   a width of the opening gradually increases along the propagation direction of the pump radiation, and
   a shape of the opening is a trapezoid or an isosceles trapezoid.

7. The illumination source of claim 1, wherein an interior cross-sectional area of the gas nozzle in a plane parallel to the exit plane increases along a direction of the gas flow for at least a portion of the gas nozzle.

8. The illumination source of claim 1, wherein a shape of the opening in the exit plane is asymmetric to planes perpendicular to the propagation direction of the pump radiation.

9. The illumination source of claim 1, wherein the gas shaping element is configured to alter the profile of the gas flow during generation of the emitted radiation.

10. The illumination source of claim 1, wherein the gas shaping element is disposed at least partly in the gas flow.

11. The illumination source of claim 1, wherein the gas flow is provided by the gas delivery system into an evacuated or nearly evacuated space.

12. The illumination source of claim 1, wherein:
    the emitted radiation has a wavelength in X-ray or EUV range, and
    the wavelength is in a range from 0.01 nm to 100 nm, from 0.1 nm to 100 nm, from 1 nm to 100 nm, from 1 nm to 50 nm, or from 10 nm to 20 nm.

13. The illumination source of claim 1, wherein the illumination source comprises a temperature controlling assembly.

14. A metrology apparatus or a lithographic cell comprising: an illumination source comprising:
    a gas delivery system comprising a gas nozzle, and wherein the gas nozzle comprises an opening in an exit plane of the gas nozzle, and wherein the gas delivery system is configured to provide a gas flow from the opening for generating an emitted radiation at an interaction region, and
    a gas shaping element disposed entirely between the exit plane and a pump radiation havving a propagation direction and configured to alter a profile of the gas flow,
    wherein the illumination source is configured to receive the pump radiation and to provide the pump radiation in the gas flow.

15. The metrology apparatus or the lithographic cell of claim 14, wherein a shape of the opening in the exit plane is asymmetric to planes perpendicular to the propagation direction of the pump radiation.

16. A method comprising:
    providing a gas flow from an opening in an exit plane of a gas nozzle for receiving a pump radiation having a propagation direction and for generating an emitted radiation at an interaction region; and
    using a gas shaping element of the gas nozzle disposed entirely between the exit plane and the pump radiation to shape a profile of the gas flow, such that a gas density of the gas flow first increases to a maximum value and subsequently falls sharply in a cut-off region along the propagation direction.

* * * * *

UNITED STATES PATENT AND TRADEMARK OFFICE
CERTIFICATE OF CORRECTION

| | | |
|---|---|---|
| PATENT NO. | : 12,044,951 B2 | Page 1 of 1 |
| APPLICATION NO. | : 17/769725 | |
| DATED | : July 23, 2024 | |
| INVENTOR(S) | : Jin et al. | |

It is certified that error appears in the above-identified patent and that said Letters Patent is hereby corrected as shown below:

In the Claims

In Column 29, Claim 1, Line 23, after "nozzle," delete "and".

In Column 29, Claim 1, Line 25, after "nozzle," insert -- and --.

In Column 30, Claim 14, Line 28, after "nozzle," delete "and".

In Column 30, Claim 14, Line 35, delete "havving" insert -- having --, therefor.

Signed and Sealed this
Eleventh Day of February, 2025

Coke Morgan Stewart
*Acting Director of the United States Patent and Trademark Office*